United States Patent
Juhász et al.

(10) Patent No.: US 10,444,745 B2
(45) Date of Patent: Oct. 15, 2019

(54) METHOD FOR CONFIGURING A TESTER EQUIPPED FOR TESTING A CONTROL UNIT

(71) Applicant: dSPACE digital signal processing and control engineering GmbH, Paderborn (DE)

(72) Inventors: László Juhász, Deggendorf (DE); Jesse Lakemeier, Hamburg (DE)

(73) Assignee: dSPACE digital signal processing and control engineering Gmbh, Paderborn (DE)

( * ) Notice: Subject to any disclaimer, the term of this patent is extended or adjusted under 35 U.S.C. 154(b) by 316 days.

(21) Appl. No.: 15/415,942

(22) Filed: Jan. 26, 2017

(65) Prior Publication Data

US 2017/0212509 A1    Jul. 27, 2017

(30) Foreign Application Priority Data

Jan. 26, 2016   (DE) .......................... 10 2016 101 344

(51) Int. Cl.
   *G05B 23/02*   (2006.01)
   *G05B 17/02*   (2006.01)

(52) U.S. Cl.
   CPC ......... *G05B 23/0243* (2013.01); *G05B 17/02* (2013.01); *G05B 2219/23446* (2013.01)

(58) Field of Classification Search
   CPC ................ G05B 23/0243; G05B 17/02; G05B 2219/23446
   USPC .......................................................... 703/14
   See application file for complete search history.

(56) References Cited

U.S. PATENT DOCUMENTS

| 8,289,195 B1* | 10/2012 | Dong ................. H03H 17/0292 |
| | | 327/156 |
| 2004/0010734 A1* | 1/2004 | Ghercioiu ................. G06F 8/61 |
| | | 714/38.13 |
| 2005/0257194 A1 | 11/2005 | Morrow et al. |

(Continued)

OTHER PUBLICATIONS

German Search Report for German Application No. 102016101344 dated Mar. 27, 2018 with English translation.

(Continued)

*Primary Examiner* — Andre Pierre Louis
*Assistant Examiner* — Faraj Ayoub
(74) *Attorney, Agent, or Firm* — Muncy, Geissler, Olds & Lowe, P.C.

(57) ABSTRACT

A method for automated configuration of a tester equipped for testing a control unit. A first and second model of technical systems being executed in the tester. The execution of the models taking place periodically with defined sampling rates. An FPGA executes the first and/or the second model and a CPU executes the first or the second model. A first individual sampling rate is allocated for the first model and a second individual sampling rate is allocated for the second model. The first model is assigned for execution on either the CPU or the FPGA and the second model is assigned for execution on either the CPU or the FPGA. The tester is automatically configured for execution of the first model with the first allocated sampling rate on the FPGA or the CPU and of the second model with the second allocated sampling rate on the FPGA or the CPU.

20 Claims, 2 Drawing Sheets

100: Tester
102: Input/Output Interface
103: First Model
104: Second Model
105: FPGA
106: CPU
107: Communication Interface
200: Control Unit

(56) References Cited

U.S. PATENT DOCUMENTS

| | | | | |
|---|---|---|---|---|
| 2006/0074622 A1* | 4/2006 | Scott | ................... | G06F 11/3636 |
| | | | | 703/23 |
| 2014/0324408 A1* | 10/2014 | Merten | ................... | G06F 9/455 |
| | | | | 703/21 |
| 2015/0232083 A1* | 8/2015 | Yu | ....................... | B60W 10/06 |
| | | | | 701/22 |
| 2016/0169962 A1* | 6/2016 | Horst | ............. | G01R 31/318307 |
| | | | | 324/750.02 |

OTHER PUBLICATIONS

German Office Action for German Application No. 102016101344 dated Mar. 27, 2018 with English translation.

Juhász et al., "FPGA-Based Interface for Control of a Hybrid Micropositioning System," IEEE, pp. 2842-2847 (2009).

László Juhász, "Control of a Hybrid Micropositioning System for Use in Industry and Robotics," Thesis, University of Novi Sad, pp. 1-202 (Jun. 2011).

\* cited by examiner

Fig. 1

100: Tester
102: Input/Output Interface
103: First Model
104: Second Model
105: FPGA
106: CPU
107: Communication Interface
200: Control Unit

Fig. 2

103: First Model
104: Second Model
105: FPGA
107: Communication Interface

201: Multiple Clock Rate Component
202: Original Clock Rate Component
203: Individual Clock Rate Signals

Fig. 3

300: RCP/HIL Hybrid Configuration Device
301-304: Configuration Elements
305-305: Connecting Elements

Fig. 4

400: Graphical Program
401: First Input Value
402: Second Input Value
403: Functionality Block
404: Output Block

METHOD FOR CONFIGURING A TESTER EQUIPPED FOR TESTING A CONTROL UNIT

This nonprovisional application claims priority under 35 U.S.C. § 119(a) to German Patent Application No. 10 2016 101 344.7, which was filed in Germany on Jan. 26, 2016, and which is herein incorporated by reference.

BACKGROUND OF THE INVENTION

Field of the Invention

The present invention relates to the development of control units, such as are used in the automotive industry or in the aviation industry, for example, for controlling technical systems such as, e.g., engines or brakes. In particular, the present invention relates to testers that are used in the development process for the control unit, for example, the electronic control unit of a vehicle.

Description of the Background Art

The development of control units has become a highly complex process. New control units and new control functions should thus be tested as early in the development process as possible in order to verify general functionality and to set the direction for further development. Towards the end of the development process, it is important to test the control unit, which has already undergone extensive development, as comprehensively as possible in order to make necessary modifications based on the test results before the control unit comes into use or enters mass production, so that it functions as desired under all conditions in later operation.

The methods of hardware-in-the-loop simulation (HIL simulation) and rapid control prototyping (RCP) are known for testing control units. In HIL simulation, an electronic control unit is connected to a tester (HIL simulator) on which a software model is executed, for example of the system to be controlled or regulated by the control unit. The software model is also referred to as an environment model. With it, the tester simulates for the control unit the physical environment of its future application. In RCP, in contrast, a software model of a control unit under development or undergoing improvement is executed on the tester. With the aid of the tester in the case of RCP, then, the technical system externally connected to the tester is regulated or controlled by means of the model executed on the tester.

The software models to be executed on the tester are becoming ever more complex. For this reason, RCP and HIL testers often have multiple processors or FPGAs (Field Programmable Gate Arrays) for parallel execution of different models or parts of models. The testers must be specifically configured for each model so that the models can be executed on the CPUs and FPGAs of the testers and can communicate, which is to say exchange data, with the technical systems that are connected. Until now, it has been necessary to perform this configuration manually. Depending on whether a model or a sub-model is to be executed on a processor or an FPGA of the tester, it has been necessary until now to manually perform very different steps for the configuration.

SUMMARY OF THE INVENTION

It is therefore an object of the invention to make possible an automated configuration of HIL and RCP testers.

In an exemplary embodiment, the object is attained by a method and device for the automated configuration of a tester equipped for testing a control unit, wherein a first model of a technical system and a second model of a technical system are executed in the tester, and the execution of the models takes place periodically with defined sampling rates, wherein the first model and the second model each represent a model of a technical system to be controlled or a model of a control unit under test, and the models are present as source code in a high-level programming language, wherein the tester includes an FPGA for executing the first and/or the second model and a CPU for executing the first or the second model, the control unit under test is connected to the tester during execution of the models and a data exchange takes place between the control unit and/or the first model and/or the second model, and wherein the method includes, for example, the following steps: allocation of a first individual sampling rate for the first model and allocation of a second individual sampling rate for the second model, assignment of the first model for execution on either the CPU or the FPGA and assignment of the second model for execution on either the CPU or the FPGA, and an automatic configuration of the tester for execution of the first model with the first allocated sampling rate on the FPGA or the CPU and of the second model with the second allocated sampling rate on the FPGA or the CPU.

This method according to the invention has the advantage that it no longer makes any difference for a user carrying out configuration of the tester whether a model or a part of a model is to be executed on an FPGA or a CPU of the tester. The configuration takes place automatically in both cases, wherein it is only necessary for the execution resource (FPGA or CPU) to be allocated to the model and for sampling rates to be allocated to the models. In this context, sampling rates or execution rates indicate how often a model or a part of a model should be executed in a specific time unit for simulation. The higher the sampling rate of a model is, the more precisely a simulation based on the model can take place. Under certain circumstances, a model can be executed with a higher sampling rate if the execution takes place on an FPGA instead of on a CPU. Using this invention makes it possible by simple means to implement the tester for executing a model on an FPGA or a CPU, wherein it does not matter whether the model is intended to be executed on the CPU or the FPGA. Additional advantages reside in increased processing capacity of the tester due to optimized distribution of the models among the different execution resources as well as individually assignable sampling rates in the case of multiple models to be executed simultaneously on an FPGA, as well as an ability to distribute the models among separate program files. In addition, the method according to the invention is associated with the advantage that, for a user, configuration of the tester can take place independently of whether a model is to be executed on a CPU or an FPGA, and models can be migrated between different execution resources in a simple manner.

In an embodiment, the automatic configuration of the tester includes an automatic generation of at least one netlist from the first and/or the second model if execution on the FPGA was assigned to the first and/or the second model, an automatic generation of communication interfaces to permit data exchange between the first model, the second model, and/or the control unit, an automatic configuration of at least one partition of the FPGA by the at least one netlist and the generated communication interfaces, and an automatic configuration of a multiple clock rate component on the FPGA to provide at least one individual clock rate signal for execution of the first and/or second model on the FPGA at the individual sampling rate.

The automatic generation according to the invention of netlists, communication interfaces, and the configuration of a multiple clock rate component on an FPGA produces the advantage that multiple models or sub-models with different sampling rates can be executed on one and the same FPGA, with the result that the FPGA behaves similarly to a CPU with multiple cores. Until now, FPGAs have had to be very laboriously configured manually in order to permit parallel execution of multiple models with individual execution rates. This is now simplified considerably as a result of the automatic configuration of a multiple clock rate component on the FPGA. The multiple clock rate component can generate different clock rates with which the models can be executed on the FPGA. The netlists are a description of the connections between the modules on the FPGA, such as logic gates or memory blocks, for example. By means of this netlist, the FPGA can be configured in order to perform the functionality of the models on the FPGA. With the netlists, certain partitions of the FPGA are configured for each model. Communication interfaces are required for the individual models to be able to communicate with one another, or in other words to exchange data. By means of these communication interfaces, signals can be exchanged between different partitions of the FPGA. The communication interfaces can also serve to allow external communication. External communication includes that the models executed on the FPGA communicate with a model executed on a CPU or with a system connected to the tester.

In an embodiment, the method according to the invention also includes an automatic generation of machine language source code from the first and/or the second model if execution on the CPU was assigned to the first and/or the second model, and a linking of the generated machine language source code to the configured FPGA by means of the generated communication interfaces.

Because the models may be originally present in a high-level language, in order to execute these models on a CPU it is necessary to generate machine language source code that the CPU in question can execute.

An embodiment of the invention includes that the assignments of the models take place automatically with the allocated sampling rates being taken into account.

Until now, users have had to decide which models or parts of models should be executed on an FPGA and which models or parts of models should be executed on a CPU. The most important criterion in this decision is the sampling rate at which the model should be executed. It is often the case that high sampling rates can only be achieved if a model is executed on the FPGA, since FPGAs permit faster execution of the model's underlying source code in some cases. The automatic assignment according to this invention offers the advantage that this can take place significantly faster as compared to manual assignment. In order to make the automatic assignment possible, rules can be taken into account, for example, wherein the rules define the cases in which a model should be executed on an FPGA and the cases in which a model should be executed on a CPU. Such rules can consider, for example, the performance level of the hardware of the CPUs or FPGAs present in the tester, for example through the storage of clock frequencies. In automatic assignment, an analysis of the models or parts of models can also be done, with the analysis determining, for instance, how much time is required for execution of the model with the FPGA or the CPU.

In an embodiment, the complexity of the models and/or free computing capacity on the CPU and/or the FPGA are additionally taken into account during the automatic allocation.

The complexity of the models here can be determined on the basis of, e.g., the data types used in the model. Furthermore, the complexity can also be determined on the basis of the number of arithmetic operations, for example. The complexity can also be determined by whether the arithmetic operations to be carried out with the model can be calculated using fixed-point arithmetic or floating point arithmetic. The free computing capacity on the FPGA or the CPU or also the task turnaround times of a CPU can be another important criterion, as well. If many models are to be executed at the same time, it can be advantageous for models to be distributed between FPGAs and CPUs in such a manner that the available hardware is used as efficiently as possible. In this way data traffic, for example, can be minimized when models that exchange a lot of data with one another are executed on the same FPGA or the same CPU.

In an embodiment, the high-level programming language can be a graphical programming language. The programming of models of technical systems is frequently carried out with graphical programming languages, in which graphical blocks are connected to one another in a block diagram. A specific functionality is assigned to each graphical block in this context. These may be simple mathematical operations. On the other hand, the functionalities of graphical blocks can also be far more complex and represent complete program functions or programs. Examples of such graphical programming languages are, e.g., Simulink and LabView. The configuration according to the invention of a tester directly from graphical programming makes the development process simpler, more intuitive, faster, and less error-prone.

In an embodiment, the generation of the netlist includes the intermediate step of generating a hardware description language. When FPGAs are configured manually, hardware description languages, which are developed specifically for these purposes, are frequently used for generation of netlists. Examples of hardware description languages include VHDL and Verilog.

In an embodiment, the tester is a hardware-in-the-loop simulator or a rapid control prototyping system.

In an embodiment, the tester has an input/output interface for connecting a control unit to the tester.

In an embodiment, the configuration and the allocation of the sampling rates can be performed by an RCP/HIL hybrid configuration device, wherein the RCP/HIL hybrid configuration device is constituted such that it has a first serial arrangement of configuration elements for configuring an input/output interface and a second serial arrangement of configuration elements for configuring interfaces of the first and the second model, the configuration elements are assigned to one another, and the communication interfaces are generated while taking into account the configuration elements that are assigned to one another.

According to the invention, a tester is also included that is equipped for testing a control unit, wherein a first model of a technical system and a second model of a technical system are executed in the tester, and the execution of the models can take place periodically with defined sampling rates, wherein the first model and the second model each represent a model of a technical system to be controlled or a model of a control unit under test, and the models can be present as source code in a high-level programming language, wherein the tester has an FPGA for executing the first and/or the second model and a CPU for executing the first or the second model, the tester is equipped for connecting a control unit under test to the tester during execution of the models and for data exchange between the control unit and/or the first model and/or the second model, wherein the tester is additionally equipped for executing one of the above-described methods.

In an embodiment, the method for automated configuration of a tester equipped for testing a control unit, wherein a first model of a technical system and a second model of a technical system are executed in the tester, and the execution of the models takes place periodically with defined sampling rates, wherein the first model and the second model each represent a model of a technical system to be controlled or a model of a control unit under test, and the models are present as source code in a high-level programming language, wherein the tester includes an FPGA for executing the first and the second model, the control unit under test is connected to the tester during execution of the models, and a data exchange takes place between the control unit and/or the first model and/or the second model, includes the following steps: allocation of a first individual sampling rate for the first model and allocation of a second individual sampling rate for the second model; automatic configuration of the tester for execution of the first model with the first allocated sampling rate and of the second model with the second allocated sampling rate on the FPGA; automatic generation of at least one netlist from the first and the second model; automatic generation of communication interfaces to permit data exchange between the first model, the second model, and/or the control unit; automatic configuration of a first and a second partition of the FPGA by the at least one netlist and the generated communication interfaces; and automatic configuration of a multiple clock rate component on the FPGA to provide at least one first individual clock rate signal for execution of the first model with the first individual sampling rate and of a second individual clock rate signal for execution of the second model on the FPGA with the second individual sampling rate.

In an embodiment, the invention includes a method for automated configuration of a tester equipped for testing a control unit, wherein a first model of a technical system and a second model of a technical system are executed in the tester, and the execution of the models takes place periodically with defined sampling rates, wherein the first model and the second model each represent a model of a technical system to be controlled or a model of a control unit under test, and the models are present as source code in a high-level programming language, wherein the tester includes a first and a second FPGA for executing the first and/or the second model, the control unit under test is connected to the tester during execution of the models, and a data exchange takes place between the control unit and/or the first model and/or the second model, wherein the method includes: allocation of a first individual sampling rate for the first model and allocation of a second individual sampling rate for the second model; automatic assignment of the first model for execution on either the first FPGA or the second FPGA and assignment of the second model for execution on either the first FPGA or the second FPGA with the allocated sampling rates being taken into account; and automatic configuration of the tester for execution of the first model with the first allocated sampling rate and of the second model with the second allocated sampling rate.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
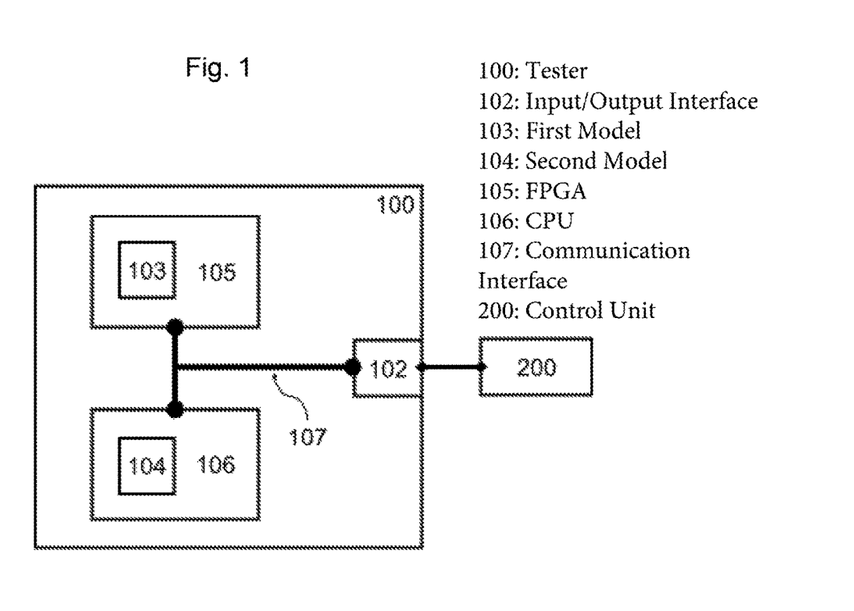
FIG. 1 shows an exemplary embodiment of a tester according to the invention.

Shown in FIG. 1 is an exemplary embodiment of a tester according to the invention 100, to which a control unit 200 is connected through an input/output interface 102. The input/output interface can have several different hardware channels, for instance digital or analog inputs and outputs at which electrical signals can be received or transmitted. A first model (103) of a technical system and a second model (104) of a technical system can be executed on the tester. In this context, a technical system can be, e.g., an engine of a motor vehicle, a motor vehicle itself or parts thereof, a control unit, or any other desired technical system. In order to execute the models, the tester contains various execution resources, such as, e.g., an FPGA 105 and/or a CPU 106. The execution resources need not necessarily be present directly in the tester, but instead can also be externally connected to the tester, for example in the form of embedded systems or plug-in cards. In the embodiment shown here, the execution resources, which is to say here a CPU 106 and an FPGA 105, are connected to a communication interface 107, for example a data bus, for data exchange with one another. This communication interface can additionally be connected to the input/output interface 103 as well, in order to thus establish communication of the models with the control unit connected to the tester.

The tester 100 can be, for example, a "hardware in the loop" (HIL) simulator. The tester 100 can also be a "rapid control prototyping" (RCP) system. However, the tester can also be a device that is suitable for performing HIL tests or RCP tests due to the fact that a model of a technical system can be executed on the tester, and this model can exchange data through input/output interfaces with a device under test that is connected to the tester, e.g., a control unit, with this data exchange being used to analyze, in particular, the reaction of the tester to data resulting from the model, which data are transmitted to the control unit in the form of electrical signals, for example.

A technical model, which is to say a model of a technical system, can by way of example, be present in the form of a software model that is specified by source code, for example in a high-level language such as C, C++, or in a machine language such as, e.g., assembler or executable machine code. Using a technical model, any desired systems can be modeled in order to simulate them virtually. Thus, for example, a model of a motor can be present as software, with the software being programmed such that during a simulation, which is to say here an execution of the model on a CPU or an FPGA, input parameters are processed by the software and output values are generated as a function of the input parameters and the nature of the model. An input parameter in this context can be, for instance, a voltage present at a throttle valve of a gasoline engine, and output values in this regard could be a resultant opening angle of the throttle valve, fuel consumption, and/or a resultant torque at the crankshaft. The model can also be a model of a control unit under test or under development, however.

FIG. 1 shows one possible configuration of a tester 100 after a method according to the invention in accordance with claim 1 has been carried out. To execute a model on the tester, an individual sampling rate is allocated to the model. Instead of a sampling rate, a sampling time can of course also be allocated in accordance with the invention, wherein the sampling rate represents the inverse of the sampling time. This allocation of the sampling rate takes place for each model that is executed on the tester. The allocation can take place manually or automatically. In the example from FIG. 1, a sampling time of 10 ms can be allocated to the first model 103 and a sampling time of 20 ms can be allocated to the second model 104, for example. Accordingly, the first model calculates new output values of the model every 10 ms, whereas the second model only calculates new output values every 20 ms with which electrical signals can then be generated that can be sent to the control unit 200. Depending on the complexity of the model, it is not always possible for an execution resource of the tester to calculate the model in the allocated sampling time. In such a case, an assignment of the model must take place for execution on a resource of the tester that has the appropriate computing performance to calculate the model in the predetermined sampling time. Thus, in the example the execution resource FPGA can be assigned to the first model 103 and the execution resource CPU can be assigned to the second model. According to the invention, an automatic configuration of the tester additionally takes place so that the tester is enabled to execute the models on the tester in such a manner that they can communicate with a device under test connected to the tester within the framework of a simulation; in the specific case of the example, this is thus a configuration of the tester for executing the first model 103 on the FPGA 105 with the sampling time 10 ms and a configuration of the tester for execution of the second model 104 on the CPU 106 with the sampling time 20 ms.

According to the invention, the allocation of the models to an execution resource can also be carried out automatically taking into account the allocated sampling rates, the complexity of the calculations performed in the model, and the data types used, as well as the already existing utilization of the execution resources or computing capacities, e.g. in the form of task turnaround times of a CPU or free logic gates of an FPGA. For this purpose, a multivariable optimization algorithm taking into account secondary conditions and a quadratic objective function can be used, for example. The objective function here can contain a maximal latency, which is to say a reaction time of the models to a change in the input values. In addition, the objective function can be extended by criteria that take into account the allocated sampling rates and the complexity of the calculations as well as the data types used. The secondary conditions in the optimization algorithm can ensure that task turnaround times of the CPU are adhered to and the FPGA contains sufficient free logic gates.

The automatic configuration can also include an automatic generation of netlists for the particular models that are to be executed on an FPGA. Various software solutions with automation interfaces, such as, e.g., the Xilinx System Generator, Matlab HDL Coder, and Xilinx Vivado HLS, can be used for this purpose, for example. From models that are present in a high-level programming language such as graphical Simulink code or C/C++, for example, these software solutions can automatically generate netlists or hardware description languages such as VHDL or Verilog code with which FPGAs can be configured to execute the program specified in the high-level programming language.

The communication interface 107 can also be generated automatically in accordance with the invention. In contrast to the form shown in FIG. 1, it can also be constituted such that it enables the communication between two models that are executed on one and the same FPGA. The communication interface 107 can also be constituted as a combined interface, which means that the communication interface is composed of multiple independent interfaces. The communication interface or even parts of a combined communication interface can be represented in a graphical programming environment as model port input and output blocks by means of which the automatic generation of the communication interfaces can be configured with regard to a data exchange.

Figure 2:
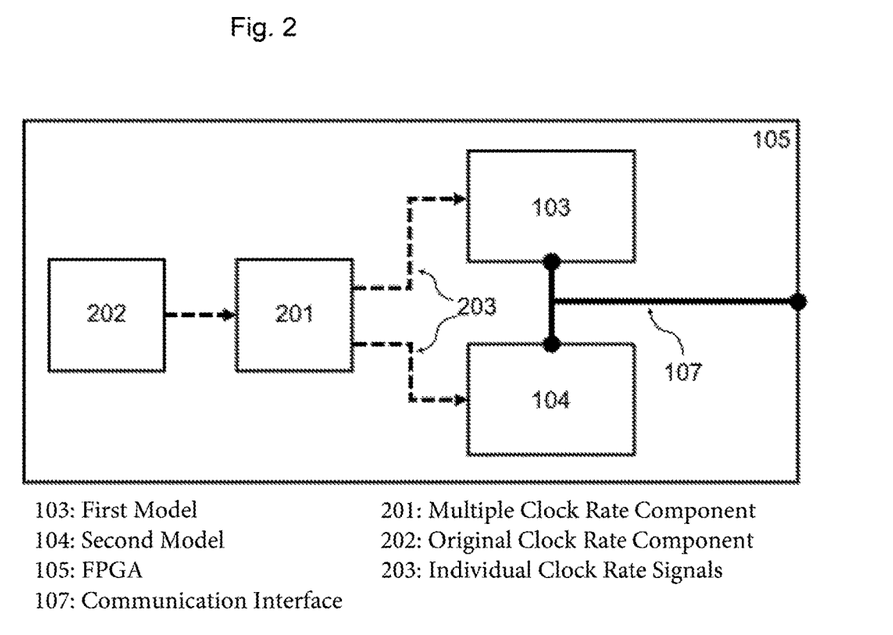
FIG. 2 shows an FPGA that was configured using the method according to the invention for executing two models.

FIG. 2 shows an FPGA 105, which, in contrast to the example shown in FIG. 1, was configured automatically such that both the first model 103 and the second model 104 can be executed on the FPGA 105. For parallel execution of the models on the same FPGA, one partition is configured for execution of the first model and a second partition is configured for execution of the second model. So that each of the two models 103 and 104 can be executed with individual clock rates on the FPGA, the models receive a separate clock rate signal from a multiple clock rate component. The multiple clock rate component, in turn, receives a clock rate signal from the original clock rate component 202 permanently implemented on the FPGA, which signal is transformed by the multiple clock rate component into the individual clock rate signals 203, for example into one clock rate signal that permits a sampling time of 10 ms and one clock rate signal that permits a sampling time of 20 ms. It must be noted here that the multiple clock rate component 201 is not limited to the generation of two clock rate signals, but rather is fundamentally capable of generating any arbitrary number of clock rate signals. The two models 103 and 104 can exchange data by means of the communication interface 107 during their execution, both with one another and with other execution resources of additional models being executed and with a device 200 under test connected to the tester. The multiple clock rate component can also include mechanisms for enabling debugging functions. With these mechanisms it is possible, for example, to generate a clock signal that can be used for debugging functionalities.

Figure 3:
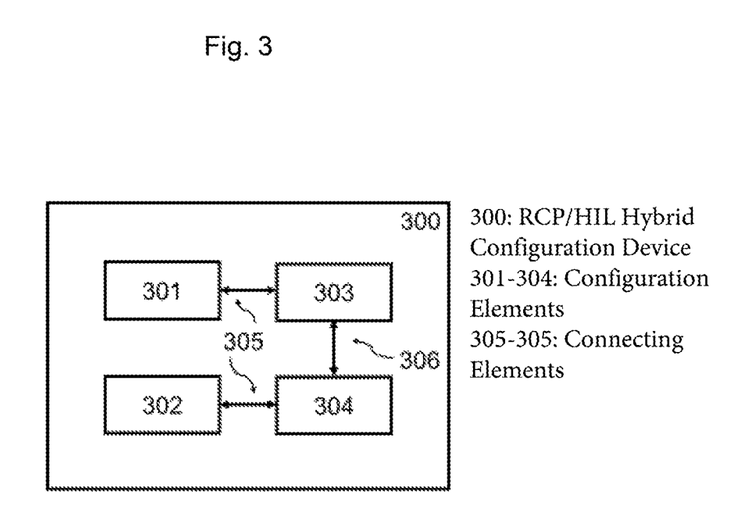
FIG. 3 depicts an exemplary form of an RCP/HIL hybrid configuration device 300.

The allocation of the sampling rates can be accomplished according to the invention by means of an RCP/HIL hybrid configuration device 300, for example, which is diagrammed in FIG. 3. An RCP/HIL hybrid configuration environment is distinguished by the fact that RCP and/or HIL simulators can be configured with it. The RCP/HIL hybrid configuration device in FIG. 3 contains a first serial arrangement of configuration elements 301 and 302 for configuring the input/output interface of the tester 100. In addition, the RCP/HIL hybrid configuration device 300 contains a second serial arrangement of configuration elements 303 and 304 for configuring interfaces of the first and the second model. To configure the communication interface, the configuration elements 301 and 302 for configuration of the input/output interface of the tester 100 can be assigned to the configuration elements 303 and 304 for configuration of interfaces of the first and of the second model, which can be accomplished through a connection with connecting elements 305, for example. Moreover, to configure the communication interface, the configuration elements 303 and 304 for configuration of interfaces of the first and of the second model can be mutually assigned to one another, for example through a connection with an additional connecting element 306, by which means a data exchange between the models 103 and 104 can be specified.

Figure 4:
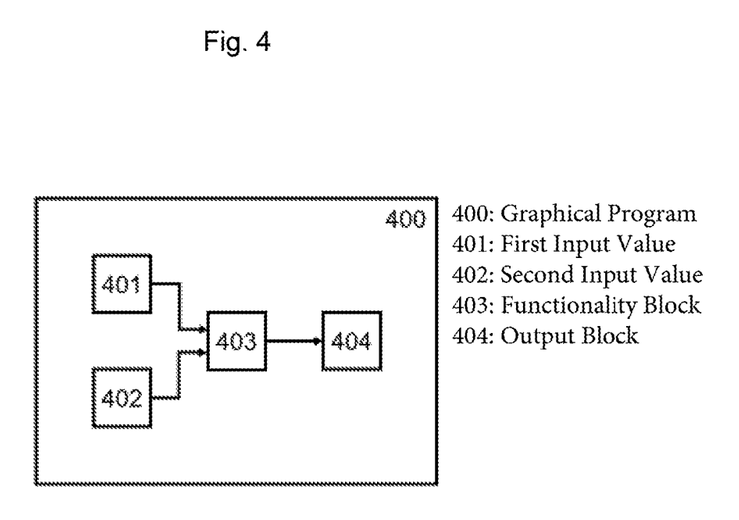
FIG. 4 shows an exemplary graphical programming language.

FIG. 4 shows an exemplary form of a graphical programming language. Here, program components and their functional relationships are configured through graphical elements, such as blocks and lines, for example. The graphical program 400 in FIG. 4 can be constituted such that, for example, said graphical program reads in a first input value 401 and a second input value 402, then further processes the read data in accordance with the functionality specified in the block 403 in order to output, by means of the output block 404, an output value calculated by means of the graphical program. The functionality of the block 403 could include, for instance, in adding or multiplying the input values, in differentiating or integrating them, or the like. The graphical blocks can be connected to one another by connecting lines in order to thus establish a data exchange between blocks. Of course, a graphical program 400 is not limited to the embodiment shown here, but instead can be significantly more complex in nature, which can be reflected in the number of blocks and connections of the blocks. The graphical program 400 can be used for modeling a technical system. Consequently, a graphical program 400 can also be a model of a technical system 103 and/or 104.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for automated configuration of a tester equipped for testing a control unit, the method comprising:
 executing in the tester a first model of a technical system and a second model of the technical system, said executing the first model and the second model taking place periodically with defined sampling rates, the first model and the second model each representing a model of the technical system to be controlled or a model of a control unit under test, the first model and second model being present as source code in a high-level programming language;
 providing in the tester an FPGA (Field Programmable Gate Array) for executing the first model and/or the second model and a CPU for executing the first model or the second model;
 connecting the control unit under test to the tester during said executing the first model and the second model and a data exchange takes place between the control unit and/or the first model and/or the second model;
 allocating a first individual sampling rate for the first model and allocating a second individual sampling rate for the second model;
 automatically assigning the first model for execution on either the CPU or the FPGA based on a rule and automatically assigning the second model for execution on either the CPU or the FPGA based on the rule; and
 configuring the tester for execution of the first model with the first allocated sampling rate on the FPGA or the CPU and of the second model with the second allocated sampling rate on the FPGA or the CPU.

2. The method according to claim 1, wherein said configuring the tester includes:
 generating at least one netlist from the first model and/or the second model if execution on the FPGA was assigned to the first and/or the second model;
 generating communication interfaces to permit the data exchange between the first model, the second model, and/or the control unit;
 configuring at least one partition of the FPGA by the at least one netlist and the communication interfaces; and
 configuring a multiple clock rate component on the FPGA to provide at least one individual clock rate signal for execution of the first model and/or the second model on the FPGA at the first individual sampling rate and/or second individual sampling rate.

3. The method according to claim 2, wherein said configuring the tester includes:
 generating machine language source code from the first model and/or the second model if execution on the CPU was assigned to the first model and/or the second model; and
 linking a generated machine language source code to a configured FPGA via the generated communication interfaces.

4. The method according to claim 1, wherein said automatically assigning the first model and the second model takes place with the first allocated sampling rate and the second allocated sampling rate being taken into account.

5. The method according to claim 1, wherein a complexity of the first model and the second model and/or free computing capacity on the CPU and/or the FPGA are taken into account during the assignment of the models.

6. The method according to claim 1, wherein the high-level programming language is a graphical programming language.

7. The method according to claim 2, wherein said generating the at least one netlist includes an intermediate step of generating a hardware description language.

8. The method according to claim 1, wherein the tester is a hardware-in-the-loop simulator or a rapid control prototyping system.

9. The method according to claim 1, wherein the tester has an input/output interface for connecting the control unit to the tester.

10. The method according to claim 2, wherein said configuring the tester and said allocating the first individual sampling rate and the second individual sampling rate are done via an RCP/HIL hybrid configuration device, wherein the RCP/HIL hybrid configuration device is constituted such that it has a first serial arrangement of configuration elements for configuring an input/output interface and a second serial arrangement of configuration elements for configuring interfaces of the first and the second model, the configuration elements being assigned to one another, and the communication interfaces being generated while taking into account the configuration elements that are assigned to one another.

11. The method according to claim 1, wherein the rule comprises a performance level of the CPU or the FPGA.

12. The method according to claim 1, wherein the rule comprises determining a length of time required for said executing the first model or the second model in the CPU or the FPGA.

13. The method according to claim 1, wherein said automatically assigning the first model and the second model to the CPU or the FPGA comprises analyzing a complexity of the first model and the second model by determining whether a fixed-point arithmetic operation or a floating point arithmetic operation can be performed on the first model and the second model.

14. The method according to claim 1, wherein the FPGA or the CPU is externally connected to the tester in a form of an embedded system or a plug-in card.

15. The method according to claim 1, further comprising simultaneously executing the first model and the second model of the technical system on the FPGA.

16. The method according to claim 1, further comprising executing sub-models of the technical system with different sampling rates on the FPGA.

17. The method according to claim 1, wherein the multiple clock component enables debugging functions.

18. A tester for testing a control unit, the tester comprising:
   a first model of a technical system;
   a second model of the technical system, the first and second models being executed in the tester, said executing the first model and the second model being performed periodically with defined sampling rates, the first model and the second model each representing a model of the technical system to be controlled or a model of a control unit under test, the first model and the second model being source code in a high-level programming language;
   an FPGA (Field Programmable Gate Array) for executing the first and/or the second model; and
   a CPU for executing the first and/or the second model,
   wherein the tester is configured to connect the control unit under test to the tester during execution of the first model and the second model and configured for a data exchange between the control unit and/or the first model and/or the second model, and
   wherein the tester is configured to execute a method comprising:
   executing in the tester the first model of a technical system and the second model of the technical system, said executing the first model and the second model taking place periodically with the defined sampling rates;
   providing in the tester the FPGA for executing the first model and/or the second model and the CPU for executing the first model or the second model;
   connecting the control unit under test to the tester during said executing the first model and the second model and the data exchange takes place between the control unit and/or the first model and/or the second model;
   allocating a first individual sampling rate for the first model and allocating a second individual sampling rate for the second model;
   automatically assigning the first model for execution on either the CPU or the FPGA based on a rule and automatically assigning the second model for execution on either the CPU or the FPGA based on the rule; and
   configuring the tester for execution of the first model with the first allocated sampling rate on the FPGA or the CPU and of the second model with the second allocated sampling rate on the FPGA or the CPU.

19. A method for automated configuration of a tester equipped for testing a control unit, the method comprising:
   executing a first model of a technical system and a second model of the technical system in the tester, said executing the first model or the second model being performed periodically with defined sampling rates, the first model and the second model each representing a model of the technical system to be controlled or a model of a control unit under test, the first model and the second model being source code in a high-level programming language;
   providing an FPGA (Field Programmable Gate Array) in the tester for executing the first model and the second model;
   automatically assigning the first model and the second model on the FPGA based on a rule;
   connecting the control unit under test to the tester during said executing the first model and the second model such that a data exchange takes place between the control unit and/or the first model and/or the second model;
   allocating a first individual sampling rate for the first model;
   allocating a second individual sampling rate for the second model;
   configuring the tester for execution of the first model with the first allocated sampling rate and the second model with the second allocated sampling rate on the FPGA;
   generating at least one netlist from the first model and the second model;
   generating communication interfaces to permit data exchange between the first model, the second model, and/or the control unit;
   configuring a first partition and a second partition of the FPGA by the at least one netlist and the communication interfaces; and
   configuring a multiple clock rate component on the FPGA to provide at least one of a first individual clock rate signal for execution of the first model with the first individual sampling rate and of a second individual clock rate signal for execution of the second model on the FPGA with the second individual sampling rate.

20. A method for automated configuration of a tester equipped for testing a control unit, the method comprising:
   executing a first model of a technical system and a second model of the technical system in the tester, said executing the first model and the second model being performed periodically with defined sampling rates, the first model and the second model each representing a model of the technical system to be controlled or a model of a control unit under test, the first model and the second model being source code in a high-level programming language;
   providing in the tester a first FPGA (Field Programmable Gate Array) and a second FPGA for said executing the first and/or the second model;
   connecting the control unit under test to the tester during said executing the first model and the second model such that a data exchange takes place between the control unit and/or the first model and/or the second model;
   allocating a first individual sampling rate for the first model;
   allocating a second individual sampling rate for the second model;

automatically assigning the first model for execution on either the first FPGA or the second FPGA based on a rule;

assigning the second model for execution on either the first FPGA or the second FPGA with the allocated sampling rates being taken into account; and configuring the tester for execution of the first model with the first allocated sampling rate and of the second model with the second allocated sampling rate.

* * * * *